US006891488B1

(12) United States Patent
McDaniel et al.

(10) Patent No.: US 6,891,488 B1
(45) Date of Patent: May 10, 2005

(54) SIGMA-DELTA CONVERSION WITH ANALOG, NONVOLATILE TRIMMED QUANTIZED FEEDBACK

(75) Inventors: Bart R. McDaniel, Phoenix, AZ (US); Malcolm H. Smith, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 10/696,946

(22) Filed: Oct. 30, 2003

(51) Int. Cl.[7] .............................................. H03M 3/00
(52) U.S. Cl. ........................ 341/143; 341/144; 341/155
(58) Field of Search ................................ 341/143, 118, 341/144, 145, 155, 156, 200, 185, 131, 120

(56) References Cited

U.S. PATENT DOCUMENTS

| | | | |
|---|---|---|---|
| 5,408,235 A | 4/1995 | Doyle et al. | 341/143 |
| 5,870,049 A | 2/1999 | Huang et al. | 341/144 |
| 6,061,008 A * | 5/2000 | Abbey | 341/143 |
| 6,130,632 A | 10/2000 | Opris | 341/120 |
| 6,271,782 B1 * | 8/2001 | Steensgaard-Madsen | 341/143 |
| 6,317,066 B1 | 11/2001 | Chiang | 341/144 |
| 6,346,898 B1 * | 2/2002 | Melanson | 341/143 |
| 6,411,242 B1 | 6/2002 | Oprescu et al. | 341/155 |
| 6,480,129 B1 * | 11/2002 | Melanson | 341/143 |
| 6,489,908 B2 | 12/2002 | Panasik et al. | 341/144 |
| 6,515,605 B2 | 2/2003 | Panasik et al. | 341/143 |
| 6,518,902 B2 | 2/2003 | Panasik et al. | 341/141 |
| 6,577,258 B2 | 6/2003 | Ruha et al. | 341/143 |
| 6,587,063 B1 | 7/2003 | Su | 341/143 |
| 6,611,221 B1 | 8/2003 | Soundarapandian et al. | 341/143 |

* cited by examiner

*Primary Examiner*—Brian Young
*Assistant Examiner*—John B Nguyen
(74) *Attorney, Agent, or Firm*—Trop, Pruner & Hu, P.C.

(57) ABSTRACT

An $N^{th}$-order sigma-delta analog-to-digital converter (ADC) system having multilevel quantized feedback. A multilevel quantized feedback stage incorporates a multibit, current-mode digital-to-analog converter (DAC). In one embodiment, reference current sources for the DAC may comprise a plurality of floating-gate MOS transistors so that analog nonvolatile precision linearity trimming of the feedback DAC may be accomplished. Calibration of the DAC may be performed at a relatively low refresh rate, for example, only at instances when the sigma-delta ADC system is activated.

30 Claims, 7 Drawing Sheets

SIGMA-DELTA CONVERSION WITH ANALOG, NONVOLATILE TRIMMED QUANTIZED FEEDBACK

BACKGROUND

Noise-shaping, over-sampled data converters realize processing gains in effective dynamic range by accepting increased conversion time in order to realize higher conversion accuracy. Accuracy is achieved by employing an over-sample rate (OSR) that is greater than the Nyquist sampling rate (twice the signal bandwidth). Furthermore, multilevel feedback paths may be incorporated to further extend dynamic range. Specifically in a sigma-delta analog-to-digital converter (ADC), multilevel feedback may be implemented in the form of a multibit digital-to-analog converter (DAC). When multibit feedback is applied to a sigma-delta data conversion system, the OSR can be reduced, thereby relaxing the burden on the system with respect to analog element bandwidth, settling requirements, and power consumption. Consequently, use of multilevel feedback allows higher signal bandwidths to be processed at an effectively lower conversion rate, while producing a similar dynamic range.

However, multilevel feedback in a sigma-delta data conversion system has heretofore proven somewhat intractable in its implementation. Specifically, the linearity requirement imposed on the multilevel (i.e., multibit) feedback DAC is generally required to be of the same order as the dynamic range realized by that ADC system. For example, a third-order sigma-delta ADC realizing an 86 dB dynamic range (corresponding to effective 14-bit quantization) requires that the multibit feedback DAC (perhaps 3 to 4 bits of quantization) similarly satisfies a linearity requirement of 14 bits. A feedback DAC that consistently demonstrates such a high degree of linearity has proven daunting in implementation. A number of approaches have been attempted, with only qualified success. For example, in one approach linearity in the feedback DAC has been sought through the imposition of continual calibration. This approach to calibration is typically predicated on dynamic element matching using precision passive components, such as well matched, highly linear, resistors or capacitors. However, the requisite level of passive matching may be had only through devices that occupy significant amounts of semiconductor real estate and that nonetheless tend to be sensitive to process variations.

Accordingly, what remains to be provided is a highly linear feedback stage for a sigma-delta data converter. The feedback stage should preferably obviate the need for time-consuming, repetitive calibration and voluminous precision components. In addition, simplicity of implementation and minimization of power consumption constitute salutary characteristics of the feedback stage.

BRIEF DESCRIPTION OF THE DRAWINGS

The subject analog, nonvolatile quantized trimming technique for a sigma-delta data converter may be better understood by, and it many features, advantages and capabilities made apparent to, those skilled in the art with reference to the Drawings that are briefly described immediately below and attached hereto, in the several Figures of which identical reference numerals (if any) refer to identical or similar elements, and wherein.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements in order to promote and improve understanding of embodiments of the invention.

DETAILED DESCRIPTION

Figure 1:
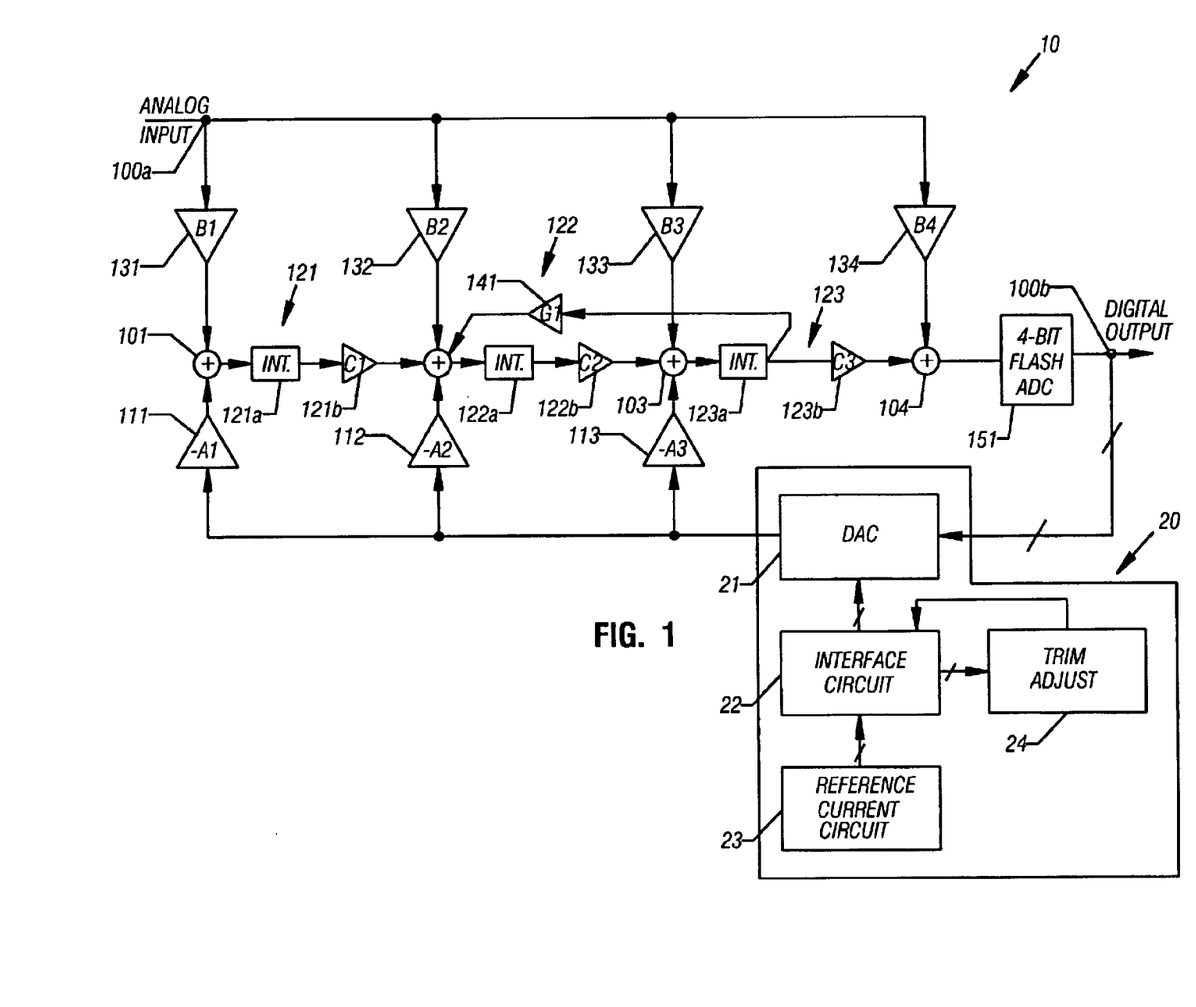
FIG. 1 is a high-level circuit diagram of a sigma-delta data converter that incorporates analog nonvolatile trimming of a quantized feedback circuit, in accordance with one embodiment of the invention.

Referring now to FIG. 1, depicted therein is a data conversion system, in the form of an analog-to-digital converter (ADC) 10. ADC 10 is arranged to accept an analog input signal at an input node 100*a* and to provide a digital output signal at an output node 100*b*. In one embodiment of the invention, ADC may be a sigma-delta ADC. The operation of sigma-delta data converters is generally known in the art. See, for example, Steven R. Norsworthy, Richard Schrier, and Gabor C. Temes (Eds.), "Sigma-delta Data Converters: Theory Design, and Simulation, Wiley-IEEE Press (1996). The delta-sigma architecture is applicable to numerous types of data conversion and signal processing systems, including, but not limited to, ADCs, digital-to-analog converters (DACs), modulation , demodulators, frequency synthesizers, communication recoveries, etc. Accordingly, for purposes of concision and precision, the invention is described in the context of an ADC system; however, its scope extends to all devices, now known, or hereafter devices, in which the delta-sigma architecture is developed.

Sigma-delta ADC 10 is seen in FIG. 1 to comprise a plurality of integrator stages, 121, 122, and 123, respectively. Although ADC 10 is shown to consist of three integrator stages in FIG. 1, the invention is not limited to a particular number of feedback stages. Integrator stage 121 is coupled between an input summing node 101 and an interstage summing node 102. Integrator stage 122 is coupled between interstage summing node 102 and interstage summing node 103. Integrator stage 123 is coupled between interstage summing node 103 and interstage summing node 104. Each of the integrator stages may comprises a respective integrator (121*a*, 122*a*, and 123*a*), followed by a gain block (amplifier) 121*a* (C1), 122*b* (C2), 123*c* (C3), respectively.

A sigma-delta data conversion system having M integrator stages is commonly referred to as an "$M^{th}$-order" data conversion system. Consequently, ADC 10 may be referred to as a $3^{rd}$-order sigma-delta ADC. However, the invention is not limited to a data conversion system of a specific order.

Consistent with FIG. 1, an analog input signal that is applied to input node 100a is coupled though noninverting gain block 131 (B1) to input summing node 101, through noninverting gain block 132 (B2) to interstage summing node 102, through noninverting gain block 133 (B3) to interstage summing node 103 and through noninverting gain block 134 (B4) to interstage summing node 104. An analog-to-digital converter (ADC) 151 is coupled between interstage summing node 104 and digital output node 100b. In one embodiment, ADC 141 may be, for example, a four-bit flash ADC.

Multilevel, quantized feedback for the sigma-delta ADC may, in one embodiment, be provided by a feedback stage 20. In one embodiment of the invention, feedback stage 20 may comprise a four-bit, current-mode digital-to-analog converter (DAC) 21 and a nonvolatile analog-trimmed reference current circuit 22. Reference current circuit 23 may constitute an array that comprises a number (four, for example) of individual reference current sources. Design and operation of feedback stage 20, including current-mode DAC 21 and analog-trimmed nonvolatile reference current circuit 22, are described in detail below.

As illustrated in FIG. 1, reference current circuit 23 is coupled to DAC 21 through an interface circuit 22. In general, interface circuit 22 receives a (4-bit, for example) digital signal from output node 100b and, in response to the digital signal, appropriately couples one or more reference current sources to DAC 21. Interface circuit 22 also selectably couples individual ones of reference current sources that are included in reference current circuit 23 to trim adjust circuit 24. In the trim mode of operation, which, in one embodiment of the invention, may occur immediately subsequent to each occasion upon which system 10 is activated, interface circuit 22 couples the reference current sources to trim adjust circuit 24 in a manner that enables trim adjust circuit 24 to effect linearity trimming of feedback stage 20. Exemplary embodiments of interface circuit 22 and trim adjust circuit 24, as well as a detailed definition of an exemplary version of a trimming algorithm, are provided below.

Feedback stage 20 operates to convert the digital output of the ADC 151, appearing at output node 100b, to an analog signal. The analog output of feedback stage 20 is, quantized into a number of discrete levels that correspond to the digital value of the signal that is coupled from node 100b to interface circuit 23. A high degree of linearity in the output of feedback stage 20 is a desirable performance characteristic. In this regard, linearity may be considered to be reflected in the degree to which the feedback stage 20 provides quantized analog output that changes by equal incremental amounts in response to each one-bit change in the digital input signal.

As illustrated in FIG. 1, the quantized analog output of feedback stage 20 is coupled to input summing node 101 through a inverting gain block 111 (−A1), to interstage summing node 102 through inverting gain block 112 (−A2), and to interstage summing node 103 through inverting gain block 113 (−A3).

Because feedback stage 20 comprises a 4-bit DAC 21, ADC 10 may be characterized as a third-order sigma-delta ADC with 4-bit quantized feedback.

Figure 2A:
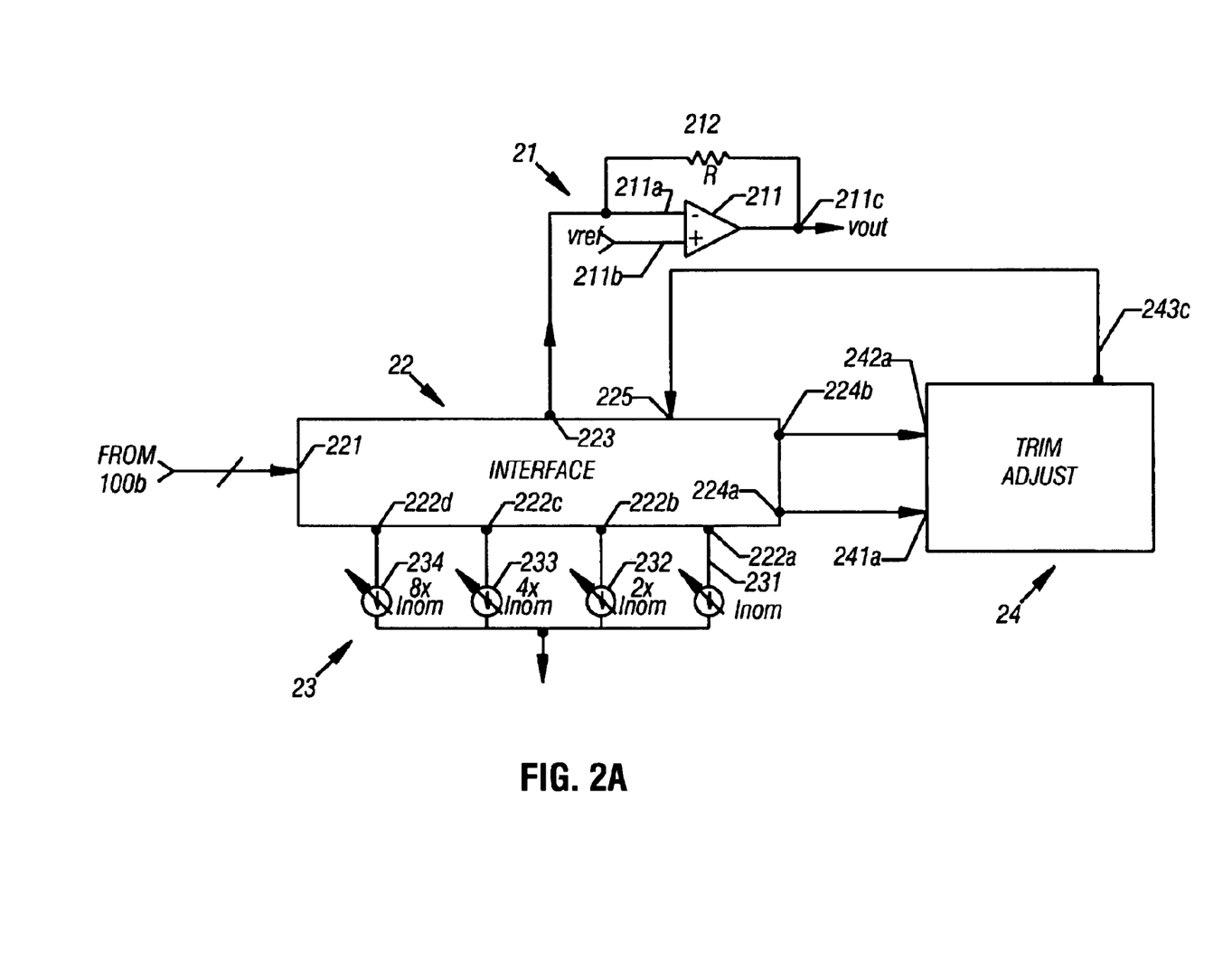
FIG. 2A is a circuit diagram of a quantized current-DAC feedback circuit with analog nonvolatile linearity trimming.

Referring now to FIG. 2A, depicted therein is a detailed block diagram of a multilevel feedback stage 20 in accordance with one embodiment of the invention. Feedback stage 20 is seen in FIG. 2A to comprise a DAC, in the form of an operational amplifier (op-amp) stage 21. Op-amp stage 21 is coupled through an interface circuit 22 to an array 23 of reference current sources. In operation, interface circuit 22 accepts at an input 221 the 4-bit digital output of ADC 151, which appears at node 100b (See FIG. 1). In response to digital input, interface circuit 22 operates to selectably couple a reference current source, from array 23, to the inverting (−) input 211a of op-amp 211. The reference current provided to op-amp 211 is effectively the sum of one or more of the binary-weighted reference current sources, 231, 232, 233 and 234, respectively, that constitute array 23.

In the reference current source array of FIG. 2A, reference current source 231 corresponds to the least significant bit (LSB) in the array. The reference current sources are arranged in ascending order, so that reference current source 234 then corresponds to the most significant bit (MSB) in array 23. As indicated, the reference current sources are binary weighted so that $I_{234}$ (the current provided by reference source 234)=$2 \times I_{233}$; $I_{233}=2I_{232}$; and $I_{232}=2I_{231}$. The magnitude of the current provided by LSB reference current source 231 may, for convenience, be referred to as $I_{nom}$. That is, $I_{231}=I_{nom}$. As an example of the manner in which interface circuit 22 operates to couple a desired reference current to input 211 of op-amp 21, consider a binary input [1010] into decoder 22. In this situation, interface circuit 22 will combine the reference currents provided by reference current sources 234 and 232, which each respectfully correspond to a binary ONE in the digital input and couple the combined current from node 223 to input 211a of op-amp 21. Because $I_{234}$ and $I_{233}$ correspond to binary ZERO in the digital input, their currents are deactivated or diverted from input 211a. Therefore, the combined reference current provided to input 211a of op-amp 21 will be $6 \times I_{nom}$, where $I_{nom}$ is a nominal reference current provided by LSB reference current source 231. The voltage at the output node is 211c of op-amp 21 will then be (depending on the value of $V_{REF}$ applied to input node 211b) $(6R) \times (I_{nom})$, where R is the magnitude of resistor 212 that couples output node 211c of op-amp 211 to inverting input node 211a.

From FIG. 1 it may be seen that the output of feedback stage 20, at node 211c, is coupled through respective gain stages 111, 112 and 113 to input summing node 101, interstage summing node 102, and interstage summing node 102, respectively. In order to achieve the desired level of linearity from feedback stage 20, in one embodiment of the invention reference current sources 231, 232, 233 and 234 are provided with a mechanism to effect linearity trimming. That is, the respective reference currents provided by reference current sources 231, 232, 233 and 234 are individually adjustable, within a limited range, so that the binary-weighted relationship, wherein current provided by a given reference current source is one-half the current provided by the next most significant current source. Furthermore, in one embodiment of the invention, the reference current source are trimmable in a nonvolatile analog manner. That is to say, an individual reference current source may be adjusted to provide a reference current that is substantially continuously variable throughout a given range, which range is approximately centered at the expected value of current provided by the respective reference current source. For example, assuming that reference current source 232 is to provide a reference current having an expected value of $2I_{nom}$, then $I_{232}$ will be continuously adjustable within a range of $2I_{nom} \pm x\%$. Furthermore, in a manner described in detail below, trimming of the reference current sources is nonvolatile in that the reference current sources maintain the trimmed current, even subsequent to termination of the trimming process.

Figure 2B:
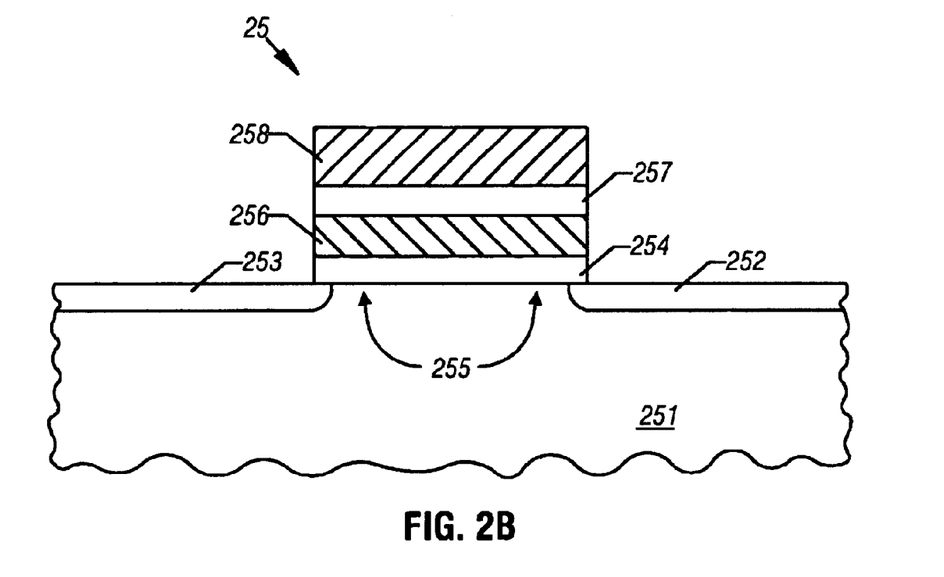
FIG. 2B is a graphical representation of a floating-gate MOS (metal oxide semiconductor) transistor reference current source.

In one embodiment of the invention the reference current sources may be implemented as floating-gate MOS (metal oxide semiconductor) transistors, as illustrated in FIG. 2B. However, the invention contemplates use of all devices, now existing or hereinafter developed, that are capable of analog, nonvolatile trimming, analogues to the trimming described below.

Directing attention to FIG. 2B, depicted there is a floating-gate MOS transistor 25 predicated on a particular thin-film storage construction. The MOS device depicted in FIG. 2B relies on a thin film of, for example, silicon nitride for charge storage and data retention. The nitride film is sandwiched between two oxide layers and the resultant multilayered structure is disposed on a semiconductor substrate. The oxide-nitride-oxide (ONO) stack is clad with an uppermost layer of polysilicon. The acronym applied to this particular form of thin-film, floating-gate MOS transistor construction is SONOS. Be aware, however, that the invention is not restricted to floating-gate MOS transistors having a SONOS construction.

As seen in FIG. 2B, in a typical embodiment, the SONOS transistor comprises a P-type substrate 251 in which there are formed an N+ drain 252 and an N30 source 253. The polarities of drain, source and channel regions are provided as examples. The invention is not constrained to a particular (i.e., P-type or N-type) MOS device.) Above the channel region 255, between drain 252 and source 253, there is deposited a layer 254 of silicon dioxide, which, in one embodiment, may be preferably between 20 and 100 angstroms in thickness. Layer 254 forms a electrical isolation over the device channel. On top of silicon dioxide layer 254 is a silicon nitride layer 256, preferably, in one embodiment, approximately 100 angstroms thick. The silicon nitride forms a charge-storage layer of the SONOS transistor, serving to trap hot electrons that are injected into the nitride layer. The charge-storage capability of the floating-gate transistor results, in a manner described below, in nonvolatile operation. Another layer of silicon dioxide 257 is formed over the silicon nitride layer, preferably to a thickness of approximately 50 to 100 angstroms. Silicon dioxide layer 257 functions to electrically isolate a conductive gate 258 formed over the silicon dioxide layer 257. The layer forming the gate 257 typically is constructed from polysilicon. A salient feature of the SONOS NVM cell is the ONO (oxide-nitride-oxide) stack that includes layers 254, 256, and 257.

Those skilled in the art understand that the drain-to-source current conducted by a MOS transistor is dependent on the threshold voltage, $V_T$, of the transistor. For an N-channel device, such as illustrated in FIG. 2B, the current flowing the channel of the transistor varies inversely with the threshold voltage, $V_T$. $V_T$, in turn, may be controlled in a floating-gate MOS transistor by controlling the amount of charge trapped in silicon nitride layer 121. That is, as negative charge carriers (i.e., electrons) are accumulated in nitride layer 120, the threshold voltage, $V_T$, of the transistor increases, and the current flowing in channel 121 decreases.

There exist a number of physical mechanisms that result in charge trapping by nitride storage layer 256. Under appropriate drain, source and gate bias voltages (which bias voltages are dependent on device geometry) electrons that originate from the source region 253 are caused to be accelerated through channel region 255. When the electrons reach the portion of channel 255 adjacent to the drain region 252, they are attracted by the positive voltage at the gate conductor 258. In a hot-carrier injection process, the charge carriers (e.g., electrons) are injected across oxide layer 254 and are trapped in a portion of silicon nitride layer 256. As the negative charge carriers traverse the channel into silicon nitride layer 256, the threshold voltage of the channel region 255 increases. Thus, the current flowing through the channel region decreases. The injected electrons remain in the nitride layer subsequent to the removal of the bias voltage.

By trimming the respective threshold in this manner, the respective currents provided by reference current sources 231, 232, 233 and 234 may be adjusted. Adjustment in the downward direction is achieved by increasing the charge trapped in the nitride storage layer. Conversely, by applying appropriate bias voltages to the drain, source and gate, trapped charge may be removed from the nitride layer, and the $V_T$ of the floating-gate reference current source will decrease, causing an increase in channel currents. In general, trapped charge may be removed from the floating gate by providing a gate voltage that is negative with respect to the applied drain voltage, thereby establishing a strong electric field in the channel region. The electric field enables electrons trapped in the nitride layer to tunnel through the bottom dielectric layer into the channel.

As indicated above, in one embodiment of the invention, linearity trimming may be imparted to feedback DAC stage 20. That is, feedback DAC stage 20 may be trimmed by adjusting the reference currents provided by respective reference current sources 231, 232, 233 and 234, depicted in FIG. 2A. In general, linearity trimming requires that the reference current provided by each of the reference current sources may be compared to a predetermined current. If the reference current is lower than the predetermined current, the reference current may be increased by lowering the $V_T$ of the respective floating-gate MOS transistor. If the reference current is high, it may be decreased by raising the $V_T$ of the respective floating-gate MOS transistor.

In one embodiment of the invention, trimming of the reference current sources is effected through a trim adjust circuit 24. Specifically, in the trimming mode of operation, interface circuit 22 may operate to disconnect the reference current sources from op-amp 211 and to appropriately couple the reference current sources from respective nodes 224a and 224b, of interface circuit 22 to input nodes 242a and 242b, respectively, of trim adjust circuit 24.

Figure 2C:
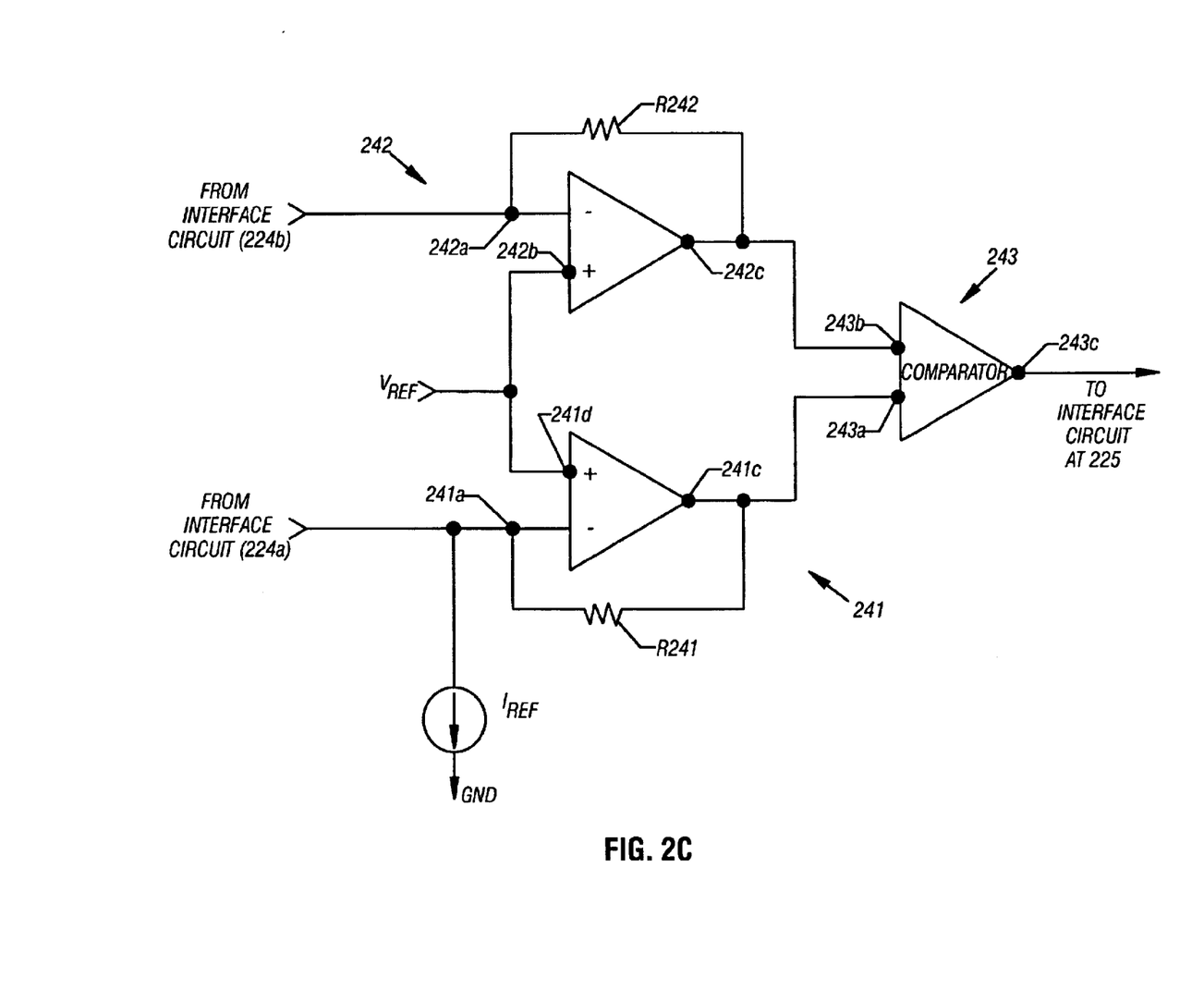
FIG. 2C is a schematic diagram of a circuit to effect linearity trimming of a feedback DAC.

Referring now to FIG. 2C, depicted therein is one embodiment of trim adjust circuit 24 (illustrated in block form in FIG. 2A). In general, the trim adjust circuit of FIG. 2C may incorporate a pair of current-to-voltage amplifiers 241 and 242, respectively. Each of the current-to-voltage amplifiers generates an output voltage, at respective outputs 241c and 242c, that is proportional to the sum of the currents applied to its respective inverting input 241a or 242a. An appropriate reference voltage, $V_{REF}$, is applied to noninverting inputs 241b and 242b. The outputs of the current-to-voltage converters are applied to respective differential inputs 243a and 243b of a comparator 243. Output 243c of comparator 243 may assume one of two voltage levels, depending on the relative magnitudes of the voltages at inputs 243a and 243b. The two voltage levels at the output of comparator 243 are designed to be voltages that are effective to cause either an increase or to cause a decrease in the $V_T$ of a reference current source (i.e., floating-gate MOS transistor), thereby appropriately forcing equality between a current applied to input 242a and the sum of the currents applied to input 241a.

Trim adjust circuit 24, or an equivalent, may be designed to operate in accordance with any one of a number of algorithms, under hardware or software control, to effect linearity trimming of feedback stage 20 (See FIG. 2). In one embodiment, in the trim mode of operation, decoder 23 sequentially causes an appropriate reference current (or combination of reference currents) to be coupled from node 224a to node 242a, and an appropriate reference current to be coupled from node 224b to node 242b.

In an initial step in the trimming procedure, interface circuit 22 causes the reference current provided by reference current source 221 (the least significant bit (LSB) reference current source) to appear at node 224b and to be coupled to node 242a of trim adjust circuit 24. Trim adjust circuit 24 then operates to compare $I_{231}$ to $I_{REF}$ and, depending on the relative amplitudes of those currents an appropriate voltage appears at node 241c. The voltage at node 241c is applied to node 225 of interface circuit 22. Decoder 22 routes this voltage to a control electrol, e.g. gate, of the $I_{231}$ floating-gate MOS transistor so as to cause equality between $I_{231}$ and $I_{REF}$.

In a subsequent step, interface circuit 22 causes current reference source 231 be coupled to node 224a and applied to node 241a of trim adjust circuit 24. Concurrently, interface circuit 22 causes current reference source 232 to be coupled to node 224a of trim adjust circuit 24 and applied to node 242b. In the manner described above, trim adjust circuit 24 forces $I_{232}$ to become equal to the sum of $I_{REF}$ and $I_{231}$.

In a still subsequent step, interface circuit 22 causes current reference source 231 and reference current source 232 to be coupled to node 224a and applied to node 241a. Concurrently, interface circuit 22 causes current reference source 233 to be coupled to node 224b and applied to node 242a. In the manner described above, trim adjust circuit 24 forces $I_{233}$ to become equal to the sum of $I_{REF}$, $I_{231}$, and $I_{232}$.

In a final step (assuming four-bit quantization of feedback), interface circuit 22 causes current reference sources 231, 232, and 233 to be coupled to node 224a and applied to node 241a. Concurrently, interface circuit 22 causes current reference source 234 to be coupled to node 224b and applied to node 242a. In the manner described above, trim adjust circuit 24 forces $I_{234}$ to become equal to the sum of $I_{REF}$, $I_{231}$, $I_{232}$, and $I_{233}$.

In one embodiment of the invention, the linearity process is undertaken only when sigma-delta data converter 10 is activated (i.e. at "POWER ON"). As an initial step, the current provided by reference current source 231 (the LSB reference current source) is compared by trim adjust circuit 24, and current provided by reference current source 231 is caused to be substantially equal to $I_{REF}$.

Figure 3:
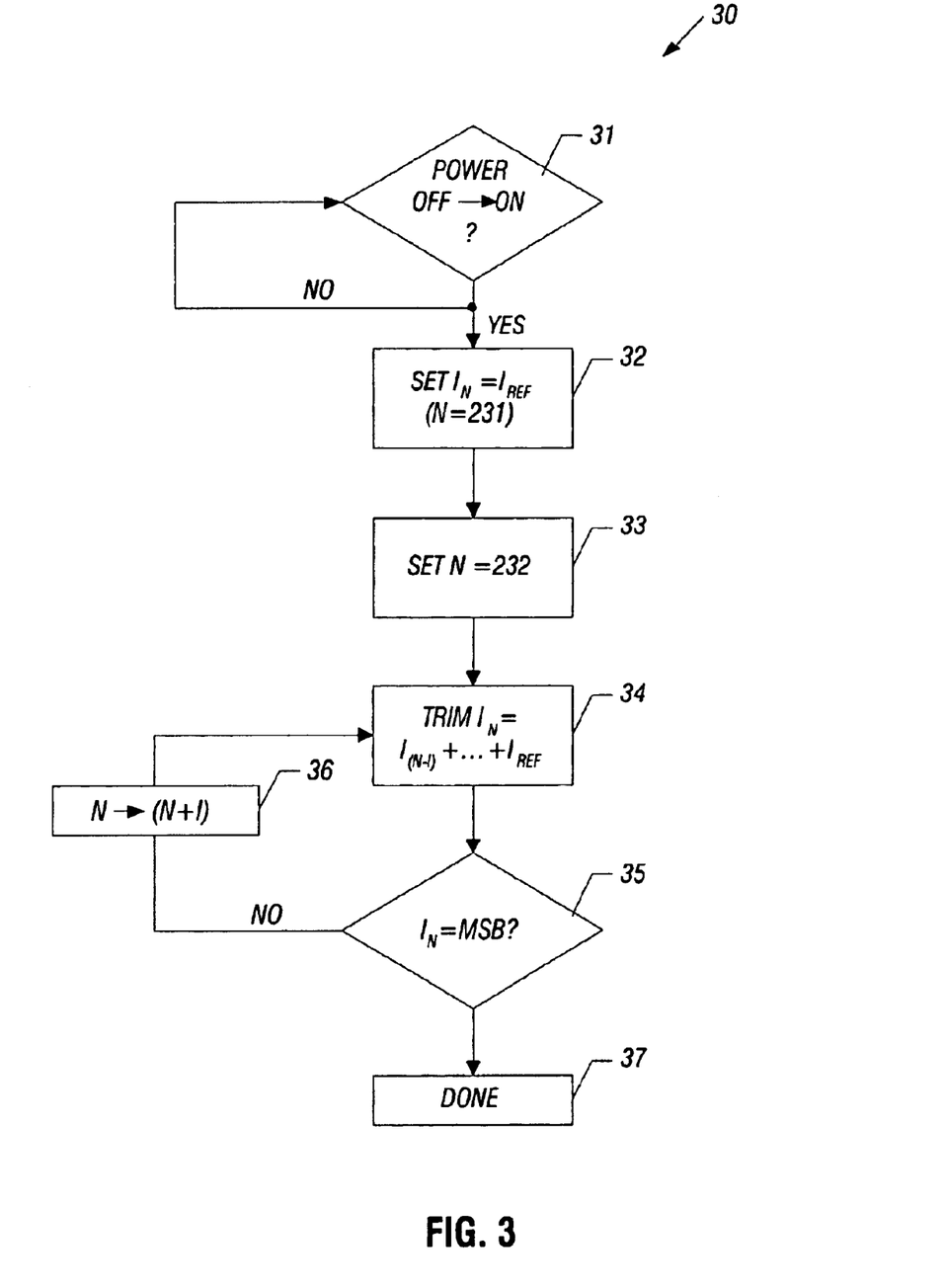
FIG. 3 is a flow diagram that illustrates, in one embodiment of the invention, the manner in which trimming is achieved for the quantized feedback circuit.

The linearity trimming process described above may, for convenience, be viewed graphically in FIG. 3. In one embodiment, suggested above, linearity trimming may be necessary only periodically, such as, for example, upon each occasion when the sigma-delta data converter system is activated. Accordingly, in step 31 a determination is made whether a "POWER OFF" to "POWER ON" state transition has recently occurred. If so, in step 32, $I_{231}$ is caused (as by $V_T$ modulation) to be matched to $I_{REF}$. Subsequently, in steps 33 and 34, $I_{232}$ is caused to be matched to the sum of $I_{REF}$ and $I_{231}$. Subsequently, each successively higher-order reference current (e.g., $I_{233}$) is caused to be matched to a lower-order combined current ($I_{REF}+I_{231}$, $+I_{232}$), until finally the MSB reference current, $I_{234}$, is caused to be matched to ($I_{REP}+I_{231}+I_{232}+I_{233}$).

Figure 4:
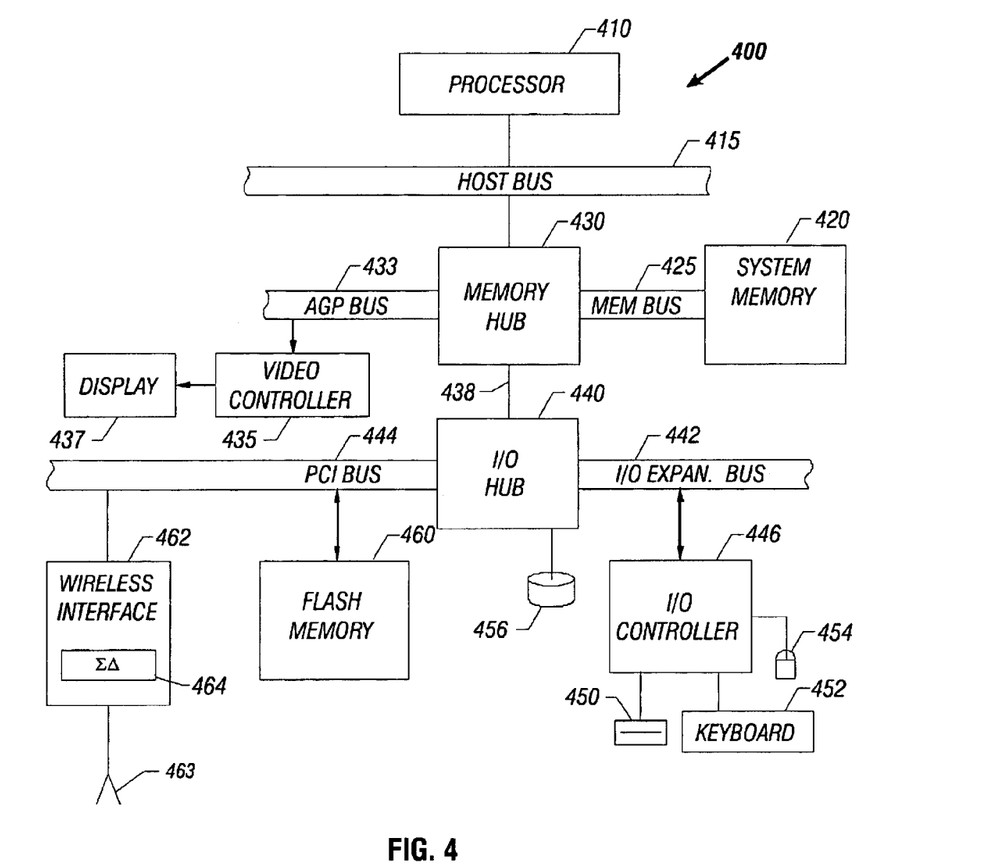
FIG. 4 is a system block diagram of a computer system in accordance with an embodiment of the present invention.

FIG. 4 is a block diagram of a representative data processing system, namely computer system, 400 with which embodiments of the invention may be used. In one embodiment, computer system 400 may be a notebook or laptop computer that includes a processor 410. Processor 410 may include a general-purpose or special-purpose processor such as a microprocessor, microcontroller, application specific integrated circuit (ASIC), a programmable gate array (PGA), and the like.

Processor 410 may be coupled over a host bus 415 to a memory hub (i.e., a memory controller) 430 in one embodiment, which may be coupled to a system memory 320 via a memory bus 425. The memory hub 430 may also be coupled over an Advanced Graphics Port (AGP) bus 433 to a video controller 435, which may be coupled to a display 437. The AGP bus 433 may conform to the Accelerated Graphics Port Interface Specification, Revision 2.0, published May 4, 1998, by Intel Corporation, Santa Clara, Calif.

Memory hub 430 may control the transfer of information within system 400, e.g., between processor 410, memory hub 430, and memory 420. That is, memory hub 430 may generate control signals, address signals, and data signals that may be associated with a particular write or read operation to memory 420.

In some embodiments, memory hub 430 may be integrated with processor 410 and/or with memory 420. In alternate embodiments, memory hub 430 may be a discrete component or dedicated chip. In other embodiments, portions of the functionality of memory hub 430 may be implemented in processor 410 or in memory 420 as, for example, a software application, module, or routine.

The memory hub 430 may also be coupled (via a hub link 438) to an input/output (I/O) hub 440 that is coupled to a input/output (I/O) expansion bus 442 and a Peripheral Component Interconnect (PCI) bus 444, as defined by the PCI Local Bus Specification, Production Version, Revision 2.1 dated in June 1995, or alternately a bus such as the PCI Express bus, or another third generation I/O interconnect bus. The I/O expansion bus 342 may be coupled to an I/O controller 446 that controls access to one or more I/O devices. As shown in FIG. 4, these devices may include in one embodiment storage devices, such as a floppy disk drive 450 and input devices, such as keyboard 452 and mouse 454. The I/O hub 440 may also be coupled to, for example, a hard disk drive 456 as shown in FIG. 4. It is to be understood that other storage media may also be included in the system. In an alternate embodiment, the I/O controller 446 may be integrated into the I/O hub 440, as may other control functions.

The PCI bus 444 may be coupled to various components including, for example, a flash memory 460. Further shown in FIG. 4 is a wireless interface 462 coupled to the PCI bus 444, which may be used in certain embodiments to communicate with remote devices. Wireless interface 462 may constitute a network interface card (NIC) into which is incorporated a sigma-delta demodulator, such as system 10 illustrated in FIG. 1. In a WLAN, wireless interface 462 may communicate with an access point (not shown). As shown in FIG. 4, wireless interface 462 may include a dipole or other antenna 463 (along with other components not shown in FIG. 4). In various embodiments, wireless interface 462 may be coupled to system 400, which may be a notebook personal computer, via an external add-in card, or an embedded device. In other embodiments wireless interface 462 may be fully integrated into a chipset of system 400.

Although the description makes reference to specific components of the system 400, it is contemplated that numerous modifications and variations of the described and illustrated embodiments may be possible. Moreover, while FIG. 4 shows a block diagram of a system such as a notebook personal computer, it is to be understood that embodiments of the present invention may be implemented in another wireless device such as a cellular phone, personal digital assistant (PDA) or the like. In such embodiments, a flash memory in accordance with an embodiment may be coupled to an internal bus which is in turn coupled to a microprocessor and a peripheral bus, which may in turn be coupled to a wireless interface and an associated antenna such as a dipole antenna, helical antenna, global system for mobile communication (GSM) antenna, and the like.

Figure 5:
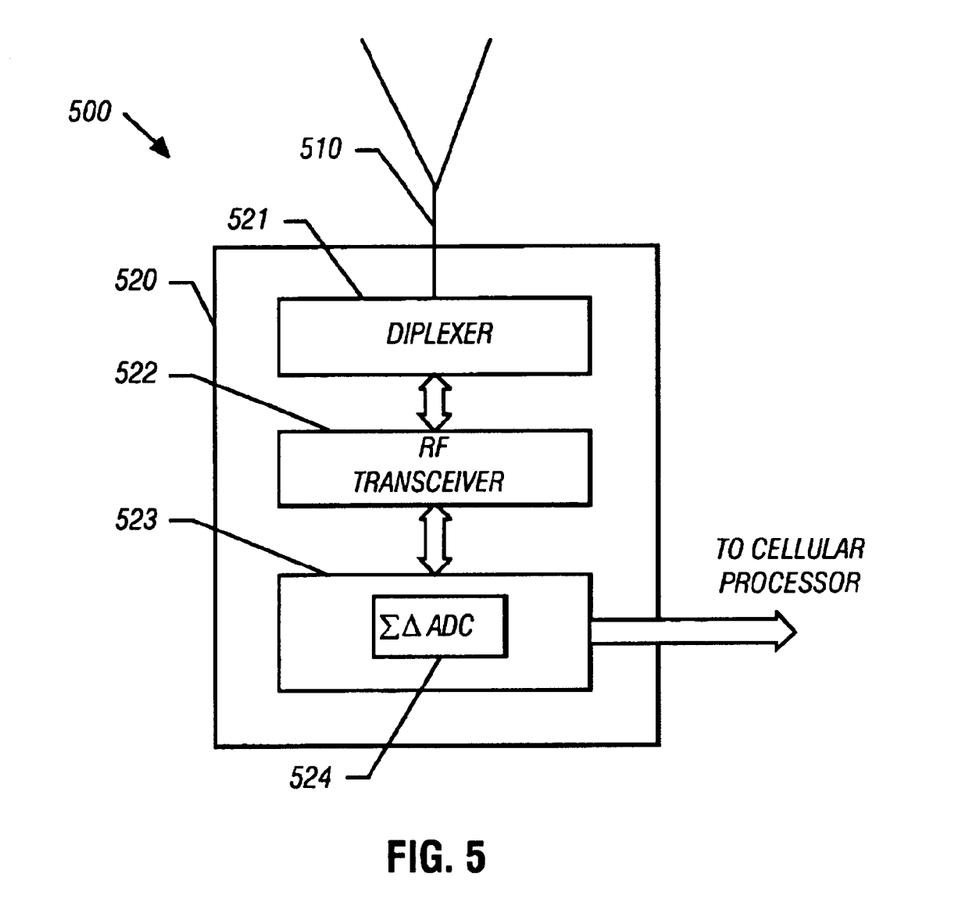
FIG. 5 is a partial system block diagram of a cellular telephone system in which an analog front end (AFE) incorporate a sigma-delta ADC in accordance with one embodiment of the invention.

In an alternative embodiment, a sigma-delta ADC may be incorporated into an analog front end (AFE) that constitutes part of a cellular telephone system. One embodiment of such an AFE is depicted in FIG. 5. As may be seen there, a cellular telephone system 500 includes an antenna 510 that is coupled to an AFE 520. AFE 520, in turn, may comprise in one embodiment, a duplexer 521 that couples an RF (radio frequency) transceiver 522 to an antenna 521. Specifically in the transmit mode of operation, diplexer 521 couples the transmitter section of RF transceiver 522 to antenna 510. In the receive mode, diplexer 521 couples the receiver section of RF transceiver 522 to antenna 510. RF transceiver 522 is also coupled to an analog mixed signal section 523 may incorporate a sigma-delta ADC 524 to perform, for example, a modulation and/or demodulation function. AFE 520 is coupled to a cellular processor (not shown).

In addition, skilled practitioners recognize that embodiments may also be realized in software (or in the combination of software and hardware) that may be executed on a host system, such as, for example, a computer system, a wireless device, or the like. Accordingly, such embodiments may comprise an article in the form of a machine-readable storage medium onto which there are written instructions, data, etc. that constitute a software program that defines at least an aspect of the operation of the system. The storage medium may include, but is not limited to, any type of disk, including floppy disks, optical disks, compact disk read-only memories (CD-ROMs), compact disk rewritables (CD-RWs), and magneto-optical disks, and may include semiconductor devices such as read-only memories (ROMs), random access memories (RAMs), erasable programmable read-only memories (EPROMs), electrically erasable programmable read-only memories (EEPROMs), flash memories, magnetic or optical cards, or any type of media suitable for storing electronic instructions. Similarly, embodiments may be implemented as software modules executed by a programmable control device, such as a computer processor or a custom designed state machine.

Accordingly, from the Description above, it should be abundantly clear that the subject invention constitutes a substantial advance in sigma-delta data converter design. To wit: the nonvolatile nature of the floating-gate MOS transistor allows the analog trimmed DAC to require calibration at a much lower refresh rate than heretofore indicated. For example, in one embodiment once upon power-up of the ADC system would be adequate. This DAC can also be implemented in a small area as compared to other high-precision DAC's. This is because the current sources that comprise the analog trimmed DAC are small structures in comparison to conventional DAC structures that rely upon precise passive matching.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a plurality of signal-processing stages, each signal processing stage having an output coupled to an interstage summing node;
a quantizer coupled between an interstage summing node and a digital output node; and
a multilevel quantized feedback stage having an input coupled to the output node and an output coupled to interstage summing nodes, the feedback stage comprising an analog-trimmed nonvolatile reference circuit.

2. An apparatus as defined in claim 1, wherein the feedback stage comprises a multibit digital-to-analog converter (DAC).

3. An apparatus as defined in claim 2, wherein the feedback stage comprises a plurality of analog nonvolatile reference current sources.

4. An apparatus as defined in claim 3, wherein each of the reference current sources comprises a floating-gate metal-oxide-semiconductor (MOS) transistor.

5. An apparatus as defined in claim 4, wherein the reference current sources are constructed to be trimmed by adjustment of a respective voltage applied to a control electrode of each of the MOS transistors.

6. An apparatus as defined in claim 1, wherein the feedback stage further comprises a digital-to-analog converter (DAC) coupled to the analog-trimmed nonvolatile reference circuit to effect linearity trimming of the feedback stage.

7. An apparatus as defined in claim 6, wherein the DAC comprises a plurality of analog-trimmed, nonvolatile reference current sources.

8. An apparatus as defined in claim 7, wherein each of the reference current sources comprises a floating-gate metal-oxide-semiconductor transistor.

9. An apparatus as defined in claim 8, wherein the reference current sources are constructed to be trimmed by application of a respective voltage to one or more of the MOS transistors so as to vary a respective threshold voltage.

10. A system comprising:
a plurality of signal-processing stages, each signal-processing stage having an output coupled to an interstage summing node;
a quantizer coupled between an interstage summing node and a digital output node;
a multilevel quantized feedback stage having an input coupled to the output node and an output coupled to interstage summing nodes, the feedback stage comprising an analog-trimmed nonvolatile reference circuit; and
an antenna coupled to the signal-processing stages.

11. A system as defined in claim 10, wherein the feedback stage comprises a multibit, current-mode digital-to-analog converter (DAC).

12. A system as defined in claim 11, wherein the DAC comprises a plurality of analog nonvolatile reference current sources.

13. A system as defined in claim 12, wherein each of the reference current sources comprises a floating-gate metal-oxide-semiconductor (MOS) transistor.

14. A system as defined in claim 13, wherein the reference current sources are constructed to be trimmed by adjustment of a respective voltage applied to a gate electrode of each of the MOS transistors.

15. A system as defined in claim 11, wherein the feedback stage comprises a plurality of analog, nonvolatile reference current sources.

16. A system as defined in claim 15, wherein each of the reference current sources comprises a floating-gate metal-oxide-semiconductor (MOS) transistor.

17. A system as defined in claim 16, wherein the reference current sources are constructed to be trimmed by adjustment of a respective voltage applied to a gate electrode of each of the MOS transistors.

18. A system as defined in claim 16, wherein reference current sources are trimmed by application of a voltage to one or more of the MOS transistors so as to vary a respective threshold voltage.

19. In a sigma-delta data converter, a method of trimming a multilevel quantized feedback stage, the method comprising:

trimming a most significant bit (MSB) reference current source by combining currents provided by other reference current sources to form a lower-order combined current;

comparing a current provided by the MSB reference current source to the lower-order combined current; and adjusting the MSB reference current source to provide a reference current that substantially matches the lower-order combined current.

20. A method as defined in claim 19, wherein the MSB reference current source comprises an analog nonvolatile semiconductor device and the MSB reference current source is adjusted by applying a voltage to a control node of the device in a manner that causes the MSB reference current source to provide a current that substantially matches the lower-order combined current.

21. A method as defined in claim 20, further comprising trimming the MSB reference current source upon occasions when the sigma-delta data converter is activated.

22. A method as defined in claim 19, further comprising:

comparing a least significant bit (LSB) reference current source to a current provided by a nominal source; and adjusting the LSB current source to provide a current that substantially matches the current provided by the nominal source.

23. A method as defined in claim 22, further comprising:

combining currents provided by the nominal current source and first LSB reference current source to form a first combined current;

comparing a current provided by a second LSB reference current source to the first combined current.

24. A method as defined in claim 23, wherein the LSB reference current source comprises an analog nonvolatile semiconductor device and the LSB reference current source is adjusted by applying a voltage to a control node of the device in a manner that causes the LSB reference current source to provide a current that substantially matches the lower-order combined current.

25. An article comprising a machine-readable stage medium containing instructions that, if executed, enable a system to trim a most significant bit (MSB) reference current source by combining currents provided by other reference current sources to form a lower-order combined current, comparing a current provided by the MSB reference current source to the lower-order combined current, and adjusting the MSB reference current source to provide a reference current that substantially matches the lower-order combined current.

26. An article as defined in claim 25, wherein the MSB reference current source comprises an analog nonvolatile semiconductor device and wherein the article further comprises instructions that, if executed, enable the system to adjust the MSB reference current source by application of a voltage to a control node of the device in a manner that causes the MSB reference current source to provide a current that substantially matches the lower-order combined current.

27. An article as defined in claim 26, further comprising instructions that, if executed, enable the system to trim the MSB reference current source upon occasions when the multilevel quantified feedback stage is activated.

28. An article as defined in claim 25, further comprising instructions that, if executed, enable the system to:

compare a least significant bit (LSB) reference current source to a current provided by a nominal source; and adjust the LSB current source to provide a current that substantially matches the current provided by the nominal source.

29. An article as defined in claim 28, further comprising instructions that, if executed, enable the system to:

combine currents provided by the nominal current source and LSB reference current source to form a first combined current; and compare a current provided by a second LSB reference current source to the first combined current.

30. An article as defined in claim 29, wherein the LSB reference current source comprises an analog nonvolatile semiconductor device and the LSB reference current source is adjusted by application of a voltage to a control node of the device in a manner that causes the LSB reference current source to provide a current that substantially matches the lower-order combined current.

* * * * *